United States Patent [19]

Hirata et al.

[11] Patent Number: 4,896,204
[45] Date of Patent: Jan. 23, 1990

[54] SEMICONDUCTOR DEVICE AND METHOD OF MANUFACTURING THEREOF

[75] Inventors: Yoshihiro Hirata; Reiji Tamaki; Takeshi Noguchi; Junichi Arima; Kenji Saitoh; Shigeru Harada, all of Hyogo, Japan

[73] Assignee: Mitsubishi Denki Kabushiki Kaisha, Tokyo, Japan

[21] Appl. No.: 224,172

[22] Filed: Jul. 25, 1988

Related U.S. Application Data

[63] Continuation of Ser. No. 914,879, Oct. 3, 1986, abandoned.

[30] Foreign Application Priority Data

Oct. 8, 1985 [JP] Japan .................. 60-224284

[51] Int. Cl.[4] .................. H01L 25/54; H01L 21/441
[52] U.S. Cl. .................. 357/67; 357/71
[58] Field of Search .................. 357/67, 71, 73, 72, 357/51

[56] References Cited

U.S. PATENT DOCUMENTS

| | | | |
|---|---|---|---|
| 3,866,311 | 2/1975 | Salles et al. | 357/51 |
| 4,471,376 | 9/1984 | Morcom et al. | 357/71 |
| 4,527,184 | 7/1985 | Fischer | 357/67 |
| 4,556,897 | 12/1985 | Yorikane et al. | 357/71 |
| 4,561,009 | 12/1985 | Yonezawa et al. | 357/73 |

FOREIGN PATENT DOCUMENTS

| | | |
|---|---|---|
| 079459 | 5/1983 | European Pat. Off. |
| 0082012 | 6/1983 | European Pat. Off. |
| 147247 | 7/1985 | European Pat. Off. |
| 52-2117551 | 3/1977 | Japan .................. 357/73 |
| 8401471 | 4/1984 | World Int. Prop. O. |

OTHER PUBLICATIONS

CRC Handbook of Chemistry and Physics, 66th Edition, 1985–1986, CRC Press, pp. B-221 and F-19.
S. P. Murarka, *Silicides for VLSI Applications*, Academic Press, 1983, p. 67.
Siemens Forschungs-und Entwicklungsberichte, vol. 13 (1984), No. 1, pp. 21–27.
NEC Research and Development, No. 25, Apr., 1972, pp. 74–80.
"Al-Ti and Al-Ti-Si Thin Alloy Films", Albertus G. Dirks et al., J. Appl. Phys., vol. 59, No. 6, Mar. 15, 1986, pp. 2010–2014.
"Stress Analysis of Passivation Film Crack for Plastic Molded LSI Caused by Thermal Stress", S. Okikawa et al., International Symposium for Testing and Failure Analysis 1983, pp. 275–280.

Primary Examiner—Joseph E. Clawson, Jr.
Assistant Examiner—S. V. Clark
Attorney, Agent, or Firm—Lowe, Price, LeBlanc, Becker & Shur

[57] ABSTRACT

An Al layer (6) is first formed to cover an opening region (9) for interconnection in a semiconductor device. Then, an Al-Si-Ti layer (7) having a higher degree of hardness than that of the Al layer (6) is formed on the Al layer (6) and subsequently a mixture layer (8) of aluminum hydrate and aluminum oxide is formed on the surface of the Al-Si-Ti layer (7). Thus, a multilayered film of electrode and interconnection (11) is formed.

4 Claims, 3 Drawing Sheets

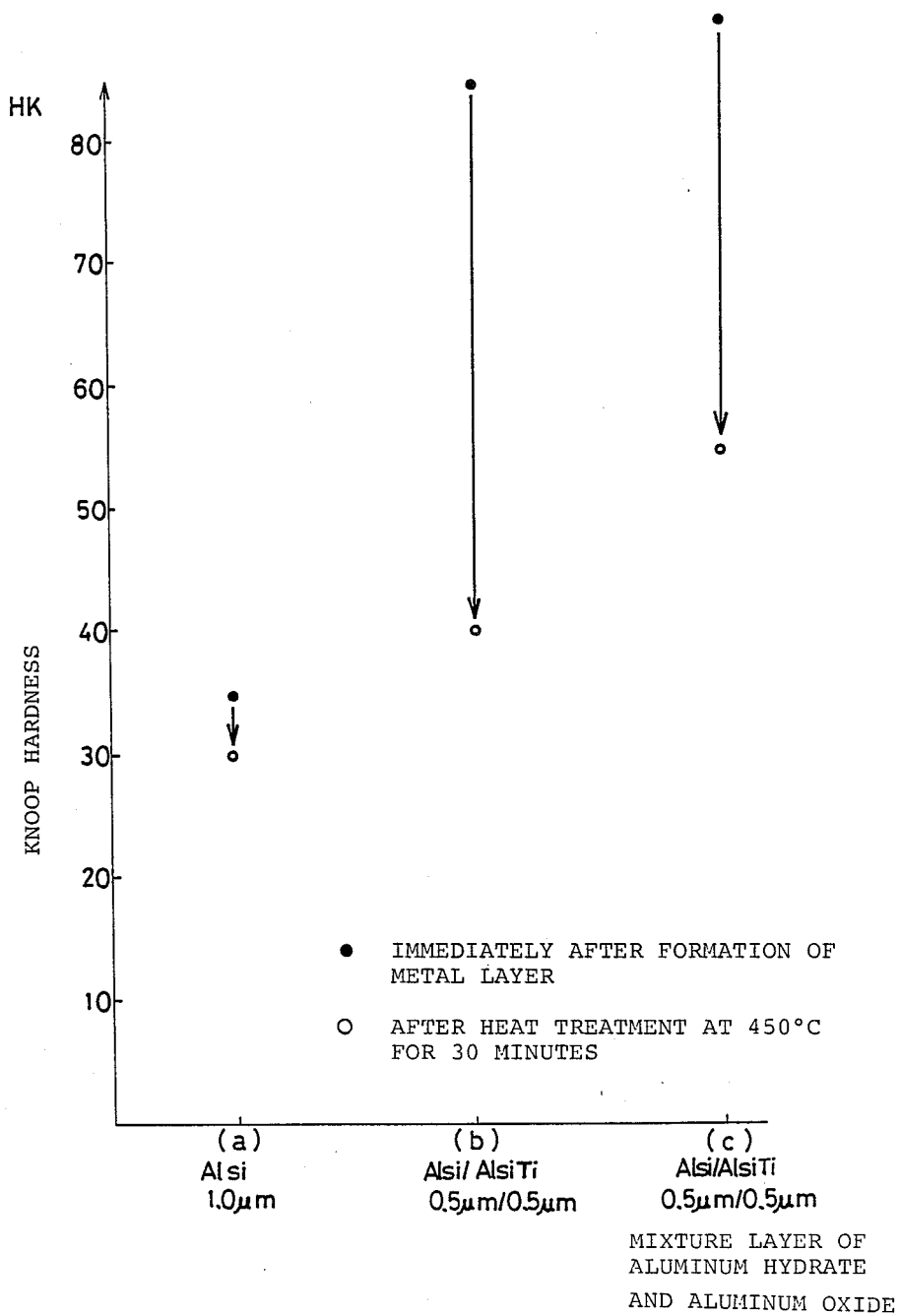

SEMICONDUCTOR DEVICE AND METHOD OF MANUFACTURING THEREOF

This application is a continuation of application Ser. No. 914,879 filed Oct. 3, 1986 abandoned Aug. 29, 1988.

BACKGROUND OF THE INVENTION

1. Field of The Invention

This invention relates to a semiconductor device and a method of manufacturing thereof and particularly it relates to a semiconductor device having an opening region for interconnection and a method of manufacturing thereof.

2. Description of the Prior Art

Aluminum and aluminum alloys are conventionally utilized as materials for an electrode and interconnection film of a semiconductor such as silicon. However, according to the recent trend toward high density and large scale integration of semiconductor devices, it becomes more and more difficult to cover a step portion of a contact hole in a semiconductor device.

FIG. 1 is a view showing a sectional structure of a conventional semiconductor device. Referring to FIG. 1, an oxide base film 2 is formed on a silicon substrate 1. A smooth coat film 3 of phospho-silicate glass is formed on the oxide base film 2. This semiconductor device is provided with a contact hole 9 for interconnection of the device. Further, an electrode and interconnection film 4 of aluminum or aluminum alloy is formed to cover the contact hole 9.

Next, a method of manufacturing of the conventional semiconductor device shown in FIG. 1 will be described. A film of Al-Si is formed by a sputtering process over the whole surface including the contact hole 9 in the silicon substrate 1 and the smooth coat film 3. At this time, the wafer is generally heated for the purpose of attaining a good state of the coverage of a step portion 5 having a level difference.

Then, patterning of the resist is made by a photolithographic process. Subsequently, unnecessary portions of the Al-Si film are removed by etching so that the electrode and interconnection film 4 including an external electrode outlet region (not shown) is obtained. Then, heat treatment at about 450° C. is applied so as to make an electric contact between the electrode and the silicon substrate 1 and to increase stability of threshold voltage of the transistor.

FIG. 2 is a graph showing hardness of different kinds of connection layers. If heat treatment is applied after an Al-Si connection layer 4 of about 1 μm in thickness for example has been formed in a conventional semiconductor device manufactured by the above described manufacturing process, the Knoop hardness becomes as low as about 30HK as shown in (a) of FIG. 2.

Particularly, because of the recent tendency to increase a chip size of an LSI, transformation of a connection region is liable to occur due to contraction stress of a mold material.

As for dependency of film hardness on Ti density before and after the heat treatment of an Al-Si-Ti layer, a description thereof is given for example in "Al-Ti and Al-Ti-Si Thin Alloy Films" by Albertus G. Dirks et al. in J. Appl. Phys., Vol. 59, No. 6, Mar. 15, 1986, pp. 2010–2014. In addition, "Stress Analysis of Passivation Film Crack for Plastic Molded LSI Caused by Thermal Stress" by Okikawa et al. in International Symposium for Testing and Failure Analysis 1983, pp. 275–280 indicates evaluation of pressure of a mold and strength of an aluminum connection layer in a chip. However, none of those documents discloses a connection layer having a high degree of hardness which can be maintained after heat treatment.

SUMMARY OF THE INVENTION

A primary object of this invention is to provide a semiconductor device comprising an electrode and interconnection film having such a high degree of hardness that it can be prevented from being transformed, the high degree of hardness of the electrode and interconnection film being attained and maintained without deteriorating coverage of a step portion of a contact hole in the semiconductor device.

Briefly stated, this invention is a semiconductor device comprising an electrode and interconnection film obtained by: forming a first metal layer covering an opening region for interconnection; forming on the first metal layer a second metal layer having a higher degree of hardness than that of the first metal layer; and forming a mixture layer of aluminum hydrate and aluminum oxide on the second metal layer.

Therefore, according to this invention, the mixture layer of aluminum hydrate and aluminum oxide formed on the first and second metal layers has an extremely high degree of hardness and as a result little transformation of the electrode and interconnection film occurs at the time of heat treatment.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a graph showing hardness of different kinds of connection layers.

DESCRIPTION OF THE PREFERRED EMBODIMENTS

Figure 1:
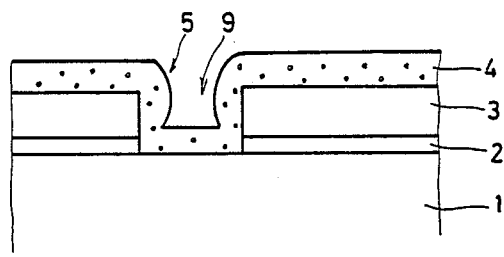
FIG. 1 is a view showing a sectional structure of a conventional semiconductor device.
Figure 3A:
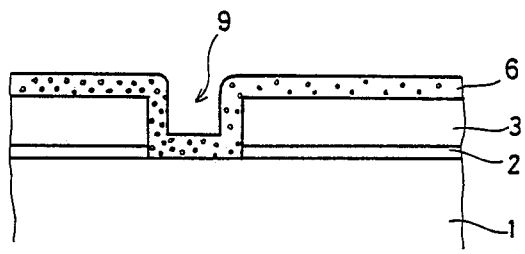
FIGS. 3A to 3D are sectional views of a semiconductor device for explaining sequential steps in a method of manufacturing thereof in accordance with an embodiment of this invention.
Figure 3B:
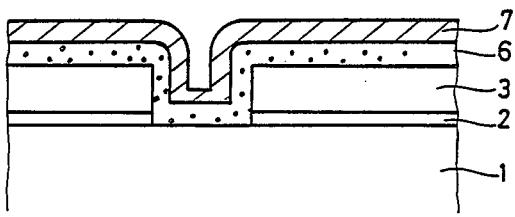
Figure 3C:
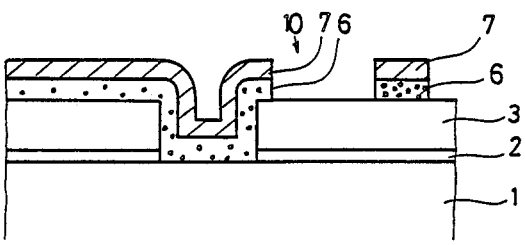
Figure 3D:
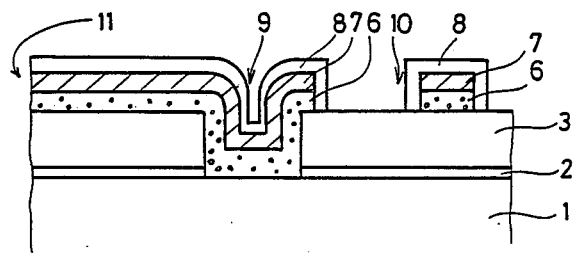

FIG. 3D is a sectional view showing a laminated structure of a semiconductor device according to an embodiment of the invention. Referring to FIG. 3D, an oxide base film 2 is formed on a silicon substrate 1 and a smooth coat film 3 is formed on the oxide base film 2. Further, a contact hole 9 for interconnection is provided in this semiconductor device. A multilayered electrode and interconnection film 11 is provided to cover the contact hole 9. This multilayered electrode and interconnection film 11 comprises a first metal layer 6, a second metal layer 7 and a layer 8 of a mixture of aluminum hydrate and aluminum oxide. The first metal layer 6 is formed of aluminum or aluminum silicon for example and the second metal layer 7 is formed of aluminum silicon titanium for example having a higher degree of hardness than that of the first metal layer 6. An external electrode outlet region 10 is provided with an outlet for external connection.

FIGS. 3A to 3D are views for explaining a method of manufacturing a semiconductor device in accordance with an embodiment of this invention. Referring to FIGS. 3A to 3D, a method of manufacturing a semiconductor device in accordance with an embodiment of this invention will be described in detail.

As shown in FIG. 3A, the contact hole 9 for interconnection is provided in a semiconductor device. The first metal layer 6 is formed on the contact hole 9 and the smooth coat film 3 by a sputtering process for example. Then, the whole of the substrate is heated for the purpose of improving coverage of the step portion of the contact hole 9. As the first metal layer 6, aluminum or aluminum silicon for example is used and this first metal layer 6 is formed to have a thickness of about 0.5 μm.

Then, as shown in FIG. 3B, the second metal layer 7 having a higher degree of hardness than that of the first metal layer 6 is formed on the first metal layer 6 also by a sputtering process so that hardness of the connection region can be improved. The wafer is not heated at this time. As the second metal layer 7, aluminum silicon titanium for example is used and this second metal layer 7 is formed to have a thickness of about 0.5 μm. Immediately after the second metal layer 7 has been formed, Knoop hardness of about 90HK is obtained as shown in (b) of FIG. 2. When heat treatment at about 450° C. is applied in that state for the purpose of making electric contact among the first metal layer 6, the second metal layer 7 and the silicon substrate 1, the hardness of the first metal layer 6 and the second metal layer 7 is rapidly lowered to about 40HK. In order to improve the hardness thus lowered, a step as shown in FIG. 3D is adopted. This step will be described afterward in detail.

Then, as shown in FIG. 3C, the first and second metal layers are patterned by a photolithographic process to form the film of electrode and interconnection. On this occasion, the external electrode outlet 10 is formed.

After the patterning is completed, the layer 8 of a mixture of aluminum hydrate and aluminum oxide is formed as shown in FIG. 3D by a method of applying hot water treatment to the whole area of the second metal layer 7 or an anodic oxidation method so that the hardness of the multilayered film of electrode and interconnection is further increased as described above. This mixture layer of aluminum hydrate and aluminum oxide has an extremely high degree of hardness and this layer 8 together with the above described second metal-layer 7 serves to further increase the hardness of the multilayered electrode and interconnection film. Consequently, even if heat treatment at 450° C. as described above is applied after the mixture layer 8 of aluminum hydrate and aluminum oxide has been formed, the hardness of the electrode and interconnection film is by far less lowered and it is maintained to be about 50HK as shown in (c) of FIG. 2 as compared with a connection film not including a mixture layer of aluminum hydrate and aluminum oxide.

The reason for little lowering of the hardness is that growth of crystal grains of aluminum or aluminum alloy is suppressed since the layer of aluminum or aluminum alloy is covered with the mixture layer of aluminum hydrate and aluminum oxide having a high degree of hardness.

If the hot water treatment as stated previously is applied, the surface of the metal layer is oxidized naturally. However, if the oxidized portion is removed by a sputtering etching process or the like, the growth rate of the mixture layer 8 of aluminum hydrate and aluminum oxide is increased. On this occasion, the mixture layer of aluminum hydrate and aluminum oxide is also formed on the smooth coat film 3 of the external electrode outlet 10 and this mixture layer portion is removed by using phosphoric acid or hydrofluoric acid. Then, the mixture layer of aluminum hydrate and aluminum oxide on the inner face of the external electrode outlet 10 is removed so that an Au wire can be connected with the metal layers 6 and 7.

As described above, the mixture layer of aluminum hydrate and aluminum oxide having a high degree of hardness is formed on the surface of the electrode and interconnection film extending over the contact hole of the semiconductor device. As a result, the multilayered electrode and interconnection film is maintained to have prescribed hardness and it is not transformed in the heat treatment process.

In addition, since the first metal layer is formed while heating the whole of the substrate, coverage of the step portion of the contact hole can be made in good state.

Although the embodiment has been described on the structure of an electrode and interconnection film formed on an opening region in an insulating film on a semiconductor substrate, the present invention is also applicable to a structure of an electrode and interconnection film formed on an opening region in an insulating film on any conductive film included in a semiconductor device, to attain a similar effect to that of the embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an electrode and interconnection film covering an opening region for interconnection, wherein
said electrode and interconnection film comprises a first metal layer comprising aluminum, a second metal layer comprising aluminum alloy formed on said first metal layer, the hardness of said second metal layer being of a higher value than that of said first metal layer, and a layer consisting essentially of a mixture of aluminum hydrate and aluminum oxide formed on said second metal layer.

2. A semiconductor device in accordance with claim 1, wherein
said aluminum alloy is aluminum silicon titanium.

3. A semiconductor device in accordance with claim 1, wherein
the first metal layer is aluminum silicon.

4. A semiconductor device having an electrode and interconnection film covering an opening region for interconnection, wherein
said electrode and interconnection film comprises a first metal layer comprising aluminum and formed on a substrate while heating the substrate, a second metal layer comprising aluminum alloy formed on said first metal layer without heating said substrate, the hardness of the second metal layer being of a higher value than that of the first metal layer, and a layer consisting essentially of a mixture of aluminum hydrate and aluminum oxide formed on the second metal layer.

* * * * *